(12) United States Patent (10) Patent No.: US 8,032,692 B2
Norman (45) Date of Patent: Oct. 4, 2011

(54) SYSTEM FOR ACCESSING NON-VOLATILE MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/931,198

(22) Filed: Jan. 25, 2011

(65) Prior Publication Data

US 2011/0125957 A1 May 26, 2011

Related U.S. Application Data

(63) Continuation of application No. 12/004,768, filed on Dec. 22, 2007, now Pat. No. 7,877,541.

(51) Int. Cl.
*G06F 12/00* (2006.01)

(52) U.S. Cl. ........ 711/103; 711/114; 711/149; 711/156; 711/E12.001; 365/63

(58) Field of Classification Search .................. None
See application file for complete search history.

(56) References Cited

U.S. PATENT DOCUMENTS

| | | | |
|---|---|---|---|
| 7,539,811 B2 | 5/2009 | Norman | |
| 7,839,702 B2 | 11/2010 | Norman | |
| 7,847,330 B2 | 12/2010 | Rinerson et al. | |
| 7,870,333 B2 | 1/2011 | Norman | |
| 2006/0171200 A1* | 8/2006 | Rinerson et al. | ........... 365/185.1 |
| 2010/0159688 A1 | 6/2010 | Rinerson et al. | |
| 2010/0161888 A1 | 6/2010 | Eggleston | |
| 2010/0274968 A1 | 10/2010 | Norman | |
| 2011/0007589 A1 | 1/2011 | Norman | |

OTHER PUBLICATIONS

U.S. Appl. No. 12/807,836, filed Sep. 14, 2010, Norman, Robert.
U.S. Appl. No. 12/924,821, filed Oct. 5, 2010, Norman, Robert.
U.S. Appl. No. 12/925,062, filed Oct. 12, 2010, Norman, Robert.
U.S. Appl. No. 12/925,373, filed Oct. 18, 2010, Norman, Robert.
U.S. Appl. No. 12/925,631, filed Oct. 25, 2010, Norman, Robert.
U.S. Appl. No. 12/927,795, filed Nov. 23, 2010, Norman, Robert.
U.S. Appl. No. 12/928,239, filed Dec. 6, 2010, Rinerson et al.
U.S. Appl. No. 12/931,114, filed Jan. 24, 2010, Norman, Robert.

* cited by examiner

*Primary Examiner* — Shawn X Gu

(57) ABSTRACT

Accessing a non-volatile memory array is described, including receiving a first data and a memory address associated with the first data, writing the first data to the non-volatile memory array at the memory address of the first data without erasing a second data stored in the non-volatile memory array at the memory address of the first data before writing the first data.

20 Claims, 6 Drawing Sheets

253

| |
|---|
| Memory Plane n     250 |
| ⋮ |
| Memory Plane 1     250 |
| Memory Plane 0     250 |
| Memory Logic     252 |

SYSTEM FOR ACCESSING NON-VOLATILE MEMORY

FIELD OF THE INVENTION

The present invention relates to semiconductors and, more particularly, to accessing non-volatile memories.

BACKGROUND

Flash memory is a type of rewritable memory chip that can maintain information without a power supply. In general, flash memory is comprised of transistors and each transistor uses an isolated floating gate to hold a charge. To program a memory cell, a lateral electric field "heats" the electrons and a transversal electric field injects carriers into the floating gate, a process called hot-electron injection. In other words, to program a memory cell, a large voltage charge is injected into the floating gate. On the other hand, erasing the memory cell removes that large voltage charge. A memory block includes multiple memory cells and to program a single memory cell, all the memory cells of the memory block are driven in the same conductive or non-conductive state (i.e., all the memory cells are erased) and thereafter, the data is programmed into the single memory cell and the rest of the memory cells in the memory block are reprogrammed. Accordingly, the erasure of a memory cell turns its bit value to "zero" and that programming the memory cell turns its bit value from "zero" to "one." However, the programming logic cannot turn a "one" bit value back to a "zero" bit value. As a result, flash memory does not allow changes to bit values at random and, to perform a write operation, the flash memory requires an erase operation before the write operation.

It should be appreciated that the erase operation requires a high voltage, requires time to complete, and, depending on the environmental conditions, the erase operation is not precise. Further, flash memory is designed with large erase blocks, causing all memory cells within the blocks to be erased at one time. To manage the erase operations and the erase block structure, the system must use a flash file system. An exemplary file management operation associated with erase operations includes copying the contents of the erased blocks to an unused portion of the flash memory before the erase operation. Another exemplary file management operation includes rewriting a header section. It should be appreciated that a header section also is erased along with a data section during an erase operation. To maintain the header section, the header section must be copied and rewritten after the erase operation. Such file management operations slow the speed of write operations and require extra memory and processing power.

There are continuing efforts to improve non-volatile memory.

BRIEF DESCRIPTION OF THE DRAWINGS

The present invention will be readily understood by the following detailed description in conjunction with the accompanying drawings, and like reference numerals designate like structural elements. Although the Drawings depict various examples of the invention, the invention is not limited by the depicted examples. Furthermore, the depictions are not necessarily to scale.

DETAILED DESCRIPTION

The invention can be implemented in numerous ways, including as a system, a process, or an apparatus. In general, the operations of disclosed processes may be performed in an arbitrary order, unless otherwise provided in the claims.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The embodiments described herein provide methods and systems for accessing a non-volatile memory array. In an embodiment, a write operation to the non-volatile memory array may be performed without an erase operation before the write operation. In other words, data may be directly written to a portion of the non-volatile memory array without first erasing the portion. In another embodiment, as further described in more detail below, the header section may be skipped over in a write operation and the data may be directly written to a data section because the header section does not need to be rewritten.

Figure 1:
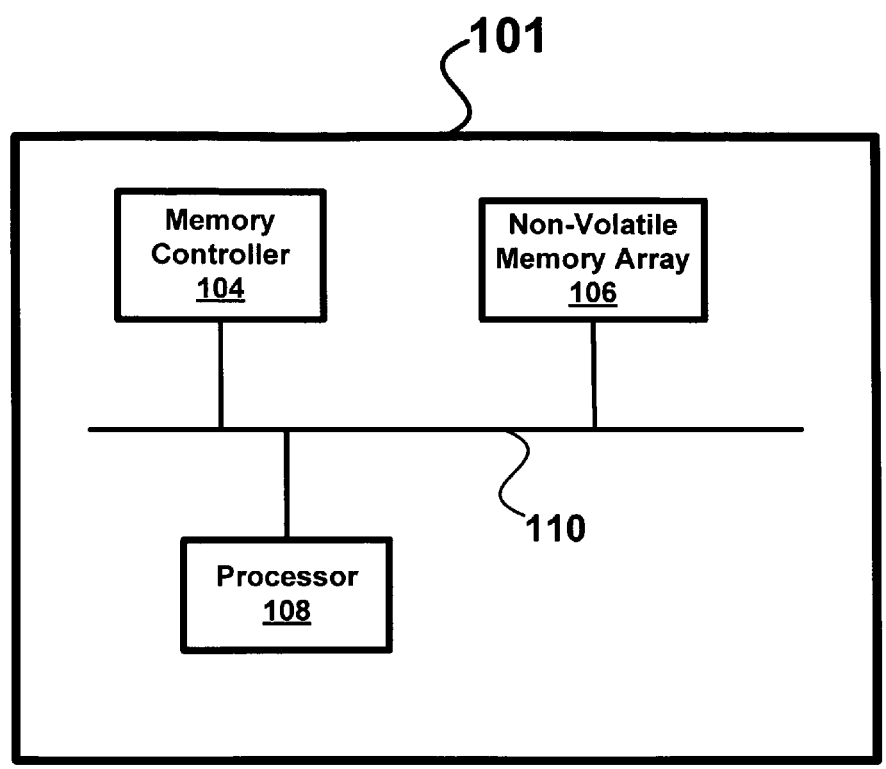
FIG. 1 is a simplified block diagram of an exemplary system for accessing a non-volatile memory array.

FIG. 1 is a simplified block diagram of an exemplary system for accessing a non-volatile memory array. As shown in FIG. 1, system 101 includes memory controller 104, non-volatile memory array 106, and processor 108. Processor 108, memory controller 104, and non-volatile memory array 106 can be in communication though bus 110 (e.g., processor bus, Universal Serial Bus (USB), IEEE 1394 (i.e., FireWire), Fibre Channel, PC Card (i.e., PCMCIA), ExpressCard, Small Computer System Interface (SCSI), Peripheral Component Interconnect (PCI), PCI Express, memory bus, HyperTransport (HT), Serial ATA, and other buses) within system 101. Processor 108 can include a variety of hardware logic that provides computational control by interpreting and executing instructions. Memory controller 104 can include a variety of hardware logic configured to control non-volatile memory array 106. For example, memory controller 104 can generate the signals to control the accessing (e.g., reading, writing, erasing, and other accessing operations) of data from non-volatile memory array 106 and can interface the non-volatile memory array with components of system 101, such as processor 108. Additionally, memory controller 104 can map physical memory addresses associated with non-volatile memory array 106 to a logical address space. As explained in more detail below, in an embodiment, memory controller 104 can be configured to perform a write operation on non-volatile memory array 106 without performing an erase operation on the non-volatile memory array 106 before the write operation.

In an embodiment, as explained in detail below, non-volatile memory array 106 can include a memory array not composed of ferroelectric capacitors. In another embodiment, non-volatile memory array 106 can include a memory array that can be vertically configured along multiple memory planes. For example, memory planes can be implemented using various types of memory technologies that permit different physical and logical arrangements (e.g., vertically stacked). In general, the vertically configured memory is a two-terminal cross-point array where, as shown in the exemplary embodiment of FIG. 2, memory arrays in the form of memory planes 250 may be stacked on top of memory logic 252. Vertically configured memory 253 allows for multiple memory planes 250 to be stacked upon one another and data may be read from and written to the memory planes, which may be further divided into memory sub-planes. Furthermore, vertically configured memory 253 allows changes to memory bits at random (i.e., random access). For example, memory technologies such as those disclosed in U.S. patent application Ser. No. 11/095,026, filed Mar. 30, 2005, now U.S. Published Application No. 2006/0171200, and titled "Memory Using Mixed Valence Conductive Oxides," hereby incorporated by reference in its entirety and for all purposes, describes two-terminal memory cells that can be arranged in a cross-point array and configured vertically (e.g., stacked one upon another). Each two-terminal memory cell stores data as a plurality of conductivity profiles that can be non-destructively sensed by applying a read voltage across the two terminals of the memory cell. That is, during a read operation in which a read voltage is applied across the two-terminal memory cell, a resistive state of stored data in the two-terminal memory cell can be non-destructively determined without disturbing the stored data (e.g., corrupting or changing the resistive value of the stored data). The memory cells are inherently non-volatile in that they retain their contents without continuous power such as main system power or a battery backup, for example. They do not require a refresh as a DRAM requires, and do not require an erase or an operating system (OS) like flash memory. They are therefore suitable for several different uses: they have sufficient performance to replace DRAM, while being non-volatile, allowing them to replace flash memory and ROM. In some examples, the above-described memory implementation may be used to replace or emulate other memory or storage technologies.

Returning to FIG. 1, in another embodiment, non-volatile memory array 106 is accessed non-destructively. For example, a read operation does not destroy a memory cell state (i.e., data stored in the memory cell). If non-volatile memory array 106 is accessed destructively, a read operation is followed by a corresponding write operation that writes the destroyed data back after the read operation. For instance, a ferroelectric ram (FeRAM) is a type of non-volatile memory composed of an array of ferroelectric capacitors. Data storage is based on the ferroelectric effect that is characterized by the remnant polarization that occurs after an electric field has been applied. A bit is read by applying an electric field across the ferroelectric capacitor, but reading the memory cell also flips the polarity of the magnetic field. As a result, with FeRAM, read operations are followed by a write to restore the contents. Therefore, in an embodiment, where non-volatile memory array 106 is accessed non-destructively, the non-volatile memory array may perform a read operation without performing a write operation after the read operation.

Figure 2:
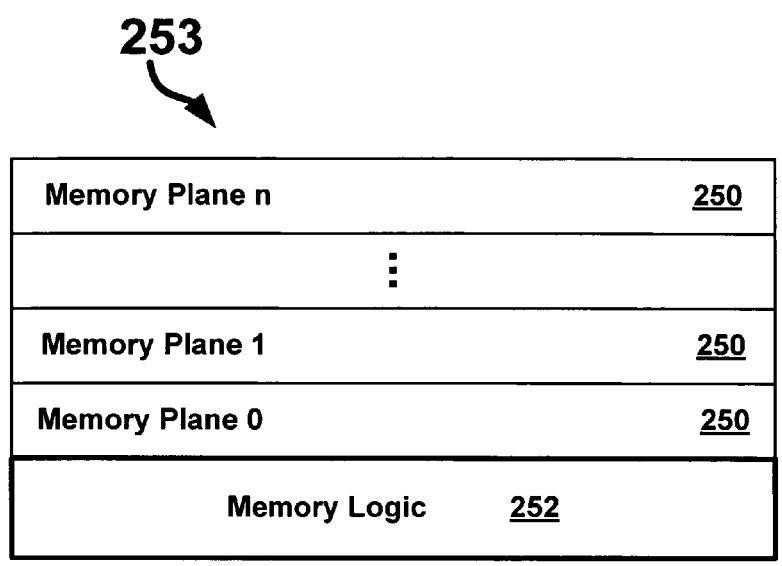
FIG. 2 is a simplified block diagram of an exemplary vertically configured memory, in accordance with an embodiment.
Figure 3:
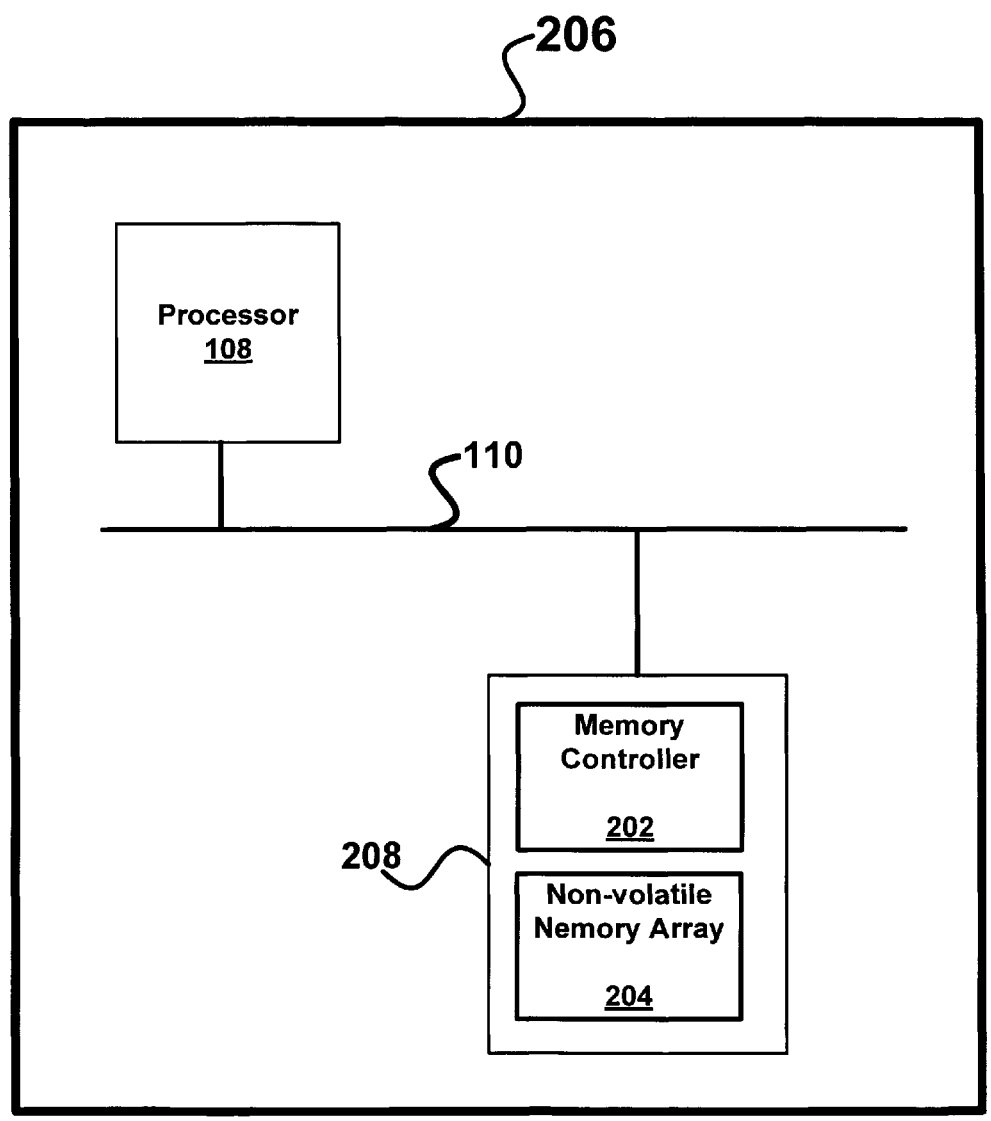
FIG. 3 is a simplified block diagram of another exemplary system for accessing a non-volatile memory array.

FIG. 3 is a simplified block diagram of another exemplary system for accessing a non-volatile memory array. As shown in FIG. 3, system 206 includes processor 108 and memory device 208. Processor 108 and memory device 208 can be in communication though bus 110 within system 206. Memory device 208 includes memory controller 202 and non-volatile memory array 204 and here, the non-volatile memory array is integrated with the memory controller. Exemplary integration of non-volatile memory array 204 and memory controller 202 may include the non-volatile memory array and the memory controller as separate chips on a printed circuit board. Another exemplary integration include memory controller 202 joined with non-volatile memory array 204, such as the memory controller located in a memory logic plane and the non-volatile memory array stacked on top of the memory controller, as depicted in FIG. 2.

Still referring to FIG. 3, memory controller 202 is situated between a host (e.g., processor 108) and non-volatile memory array 204, and system 206 may interface with memory device 208 as a peripheral device. For example, memory device 208 may be configured as a PC Card (i.e., PCMCIA). Other exemplary memory devices, such as memory device 208 that can support non-volatile memory array 204 include CompactFlash cards, SmartMedia cards, memory sticks, secure digital cards, videogame cartridges, and other memory devices. The integration of memory controller 202 with non-volatile memory array 204 in memory device 208 offloads the memory controller operations to the memory device. As a result, system resources are freed, which allows for faster operations and reduces memory demands on system 206.

Figure 4:
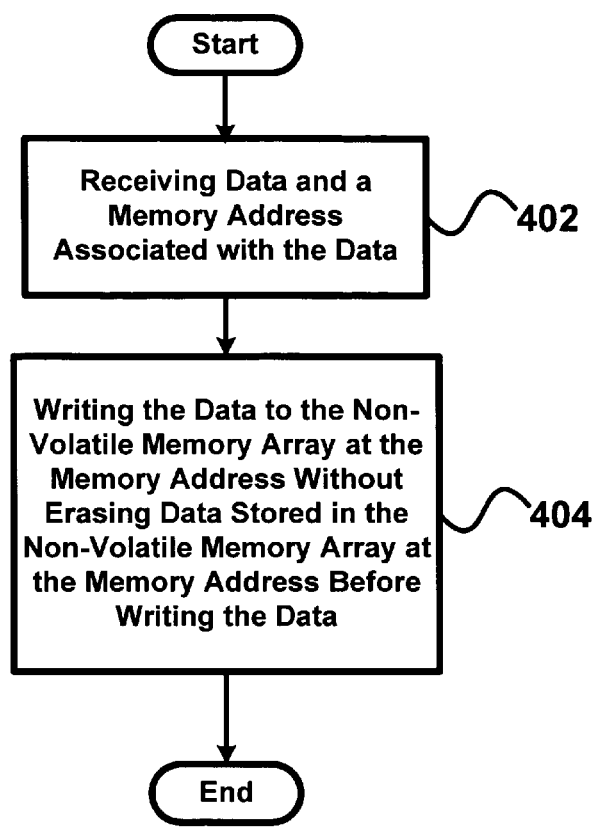
FIG. 4 is a flowchart diagram of a high level overview of an exemplary method for accessing a non-volatile memory array, in accordance with an embodiment.

FIG. 4 is a flowchart diagram of a high level overview of an exemplary method for accessing a non-volatile memory array, in accordance with an embodiment. A non-volatile memory array that is vertically configured and/or not composed of ferroelectric capacitors, such as memory technologies that can store data by manipulating the resistance of a memory cell. For example, a memory cell (i.e., a memory plug) may have two or more resistive states. Different voltages pulses (e.g., a write voltage) across the memory cell can result in different resistive states. Thus, a memory cell can be placed into multiple, different resistive states that can correspond to multi-bit memory cells. In a write operation, an appropriate voltage pulse is applied to the memory cell to change the resistive state of the memory cell. Similarly, in an erase operation, another different voltage pulse is applied to the memory cell to change the resistive state of the memory cell. Thus, write operations are independent of erase operations and, to store or write data, the non-volatile memory array does not require an erase operation before a write operation. Furthermore, the resistive state of the memory cell can be non-destructively sensed (e.g., read) by applying an appropriate read voltage across the memory cell. The read voltage generates a read current and a magnitude of the read current is indicative of the resistive state of the memory cell. Typically, a magnitude of the read voltage is less than a magnitude of the write voltage so that a read operation does not disturb or corrupt the resistive state of the memory cell. The write voltages can be applied with different magnitudes and/or polarities such that a first magnitude and polarity is operative to write a logic "0" and second magnitude and polarity is operative to write a logic "1", for example. As shown in FIG. 4, in a write operation, data and a memory address associated with the data are received in operation 402. Thereafter, in operation 404, the data is written to the non-volatile memory array at the memory address without erasing the data stored in the non-volatile memory array at the memory address before the data is written. In other words, a write operation may be performed without an erase operation before the write operation.

Thus, data can be written directly to the non-volatile memory array and write operations can be performed without erase operations interrupting the write operations. For example, write operations can be performed continuously without performing erase operations between the write operations. In other words, a succession or series of write operations can be performed following one write operation after another write operation without gaps of erase operations performed between the write operations. As a result, the logic and memory space associated with managing erase operations before write operations can be eliminated. For instance, in an embodiment, the non-volatile memory array is not configured to reserve memory blocks associated with performing erase operations before a write operation. The memory blocks are reserved for temporary storage of erased data that is to be written back to the non-volatile memory array after the erase. In another embodiment, memory controller is not configured to include an operating system and write drivers that manage erase operations.

In still another exemplary embodiment, the non-volatile memory array is not configured to store a pointer system associated with the relocation of data resulting from an erase operation before the write operation. In general, a pointer system may be used to locate data stored in the non-volatile memory. Exemplary pointer systems include chained pointers, such as File Allocation Table (FAT), and tables that store pointers to data locations. Both chained pointers and tables allow programming markers, such as zero and one values, to mark data that are obsolete or moved. With such pointer systems, a processor may parse the chained pointers or tables to locate the desired data structure. Accordingly, in an embodiment, the non-volatile memory array is not configured to store a pointer system that is associated with locating and/or moving data, but may store pointers associated with directories or file systems. For example, an exemplary file system that may be used with non-volatile memory arrays is FAT. In general, FAT is a list of entries that map to each cluster on a partition. A file is represented by a chain of clusters and FAT contains a record of how the clusters that comprise a file are linked together. FAT additionally contains a second set of chained pointers that are associated with the relocation of data as the data are moved in the non-volatile memory array. With a non-volatile memory array that is not configured to store a pointer system associated with the relation of data resulting from the erase operation, the non-volatile memory array with FAT can exclude the second set of chained pointers that are associated with the temporary relocation of data as a result of erase operations.

Figure 5A:
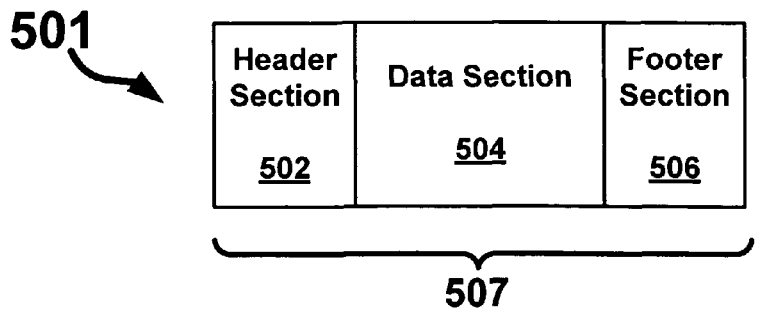
FIGS. 5A, 5B, and 5C are simplified block diagrams of exemplary file structures used with non-volatile memory arrays.
Figure 5B:
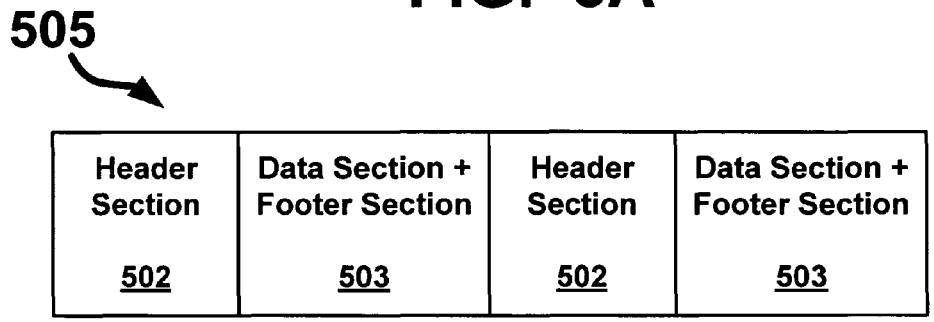
Figure 5C:
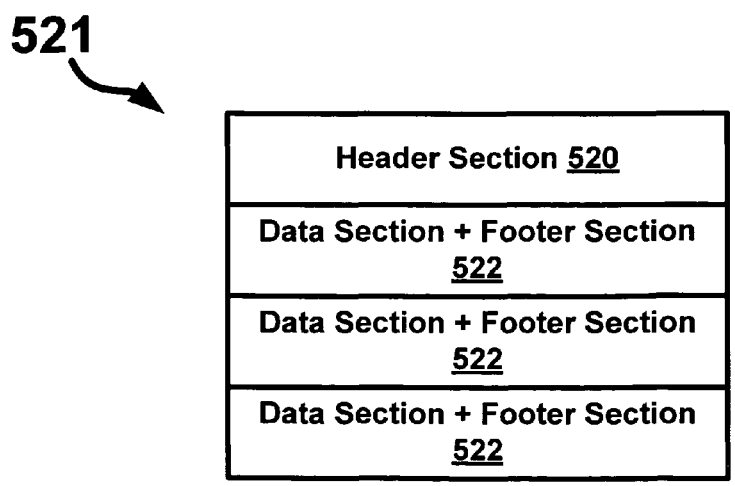

FIGS. 5A through 5C are simplified block diagrams of exemplary file structures used with non-volatile memory arrays. It should be appreciated that various file systems may be used to provide a map of the data clusters (i.e., a group of memory sectors) stored in the non-volatile memory arrays. An exemplary file system that may be used with non-volatile memory arrays is FAT, which, as described above, is a list of entries that map to each cluster on a partition. FIG. 5A shows an exemplary file structure that may be used by FAT. File structure 501 includes header sections 502, data sections 504, and footer sections 506 that may be stored in memory block 507. The individual memory cells, header section 502, data section 504, and footer section 506 that comprise memory block 507 may be identified by a memory row, a portion of a memory row, a memory column, a memory bank, a memory plane, a memory sub-plane, and other identifiers associated with non-volatile memory arrays. Depending on the memory layout, it should be noted that multiple memory blocks, such as memory block 507, can occupy a row, a portion of a row, or multiple sectors per row.

Header sections 502 of FIG. 5A may contain information associated with each data section 504 that follows each of the header sections (e.g., logical block addressing (LBA) or cylinder, head, and sector). Tags associated with defects and locations (e.g., defect pointers and alternate sector pointers) and file addresses may additionally be included in header sections 502. Footer section 506 may contain error correcting code (ECC) and information associated with defective bit replacements and defective column replacements.

FIG. 5B shows another exemplary file structure. As shown in FIG. 5B, file structure 505 includes header sections 502 and data and footer sections 503. Here, instead of having separate data sections (e.g., 504 in FIG. 5A) and footer sections (e.g., 506 in FIG. 5A), the data sections and the footer sections are merged into data and footer sections 503. FIG. 5C shows still another exemplary file structure. As shown in FIG. 5C, file structure 521 includes header section 520 and data and footer sections 522. Instead of having separate header sections for each data and footer section 522, the header sections associated with the data and footer sections are merged into one header section 520. With vertically configured memory, the division of memory blocks and file structure may be variable since the vertically configured memory does not include erase blocks and therefore, data may be written to a variety of addresses.

Figure 6:
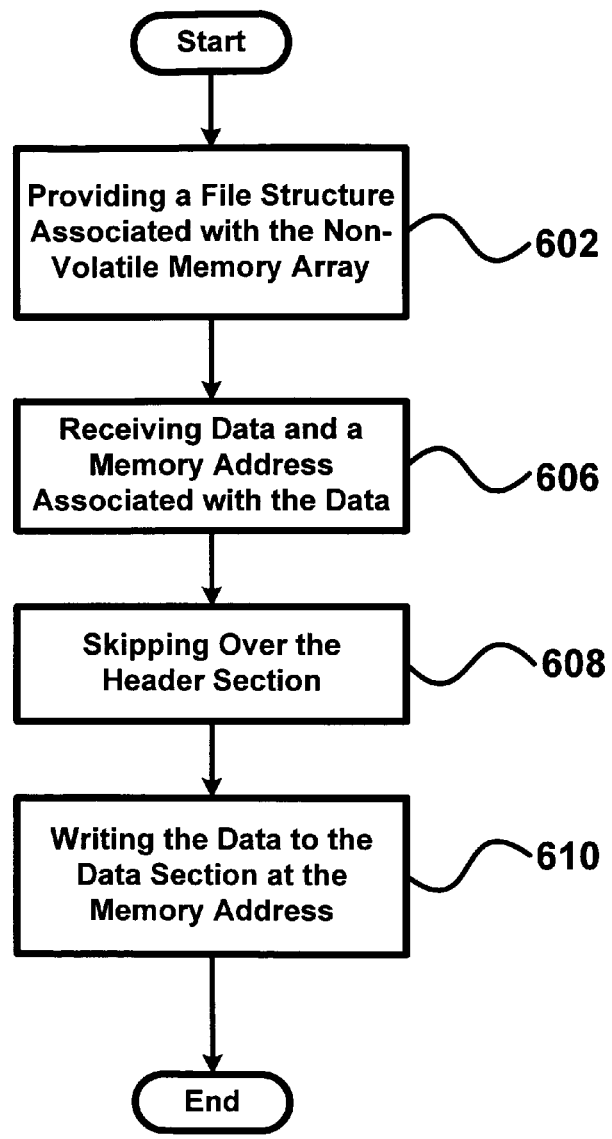
FIG. 6 is a flowchart diagram of a high-level overview of another exemplary method for accessing a non-volatile memory array, in accordance with an embodiment.

FIG. 6 is a flowchart diagram of a high-level overview of another exemplary method for accessing a non-volatile memory array, in accordance with an embodiment. As shown in FIG. 6, in a write operation, a file structure associated with the non-volatile memory array is provided in operation 602. In an embodiment, the file structure comprises a header section and a data section. As discussed above, the non-volatile memory array is configured to perform a write operation without performing an erase operation before the write operation. Accordingly, the header section is not erased and not rewritten in a write operation. Thereafter, in operation 606, data and memory address associated with the data are received. Since the header section is not erased, in operation 608, the header section is skipped over in a write operation. After the header section is skipped over, the data is written to the data section at the memory address in operation 610. In general, during a write operation, the header section is bypassed and the data is directly written to the data section. As a result, the data is written to the data section without performing an erase operation before the write, and the data can be written to the data section without rewriting the header section. For example, the method operations shown in FIG. 6 may be applied to the exemplary file structures shown in FIGS. 5A-5C. As applied to FIG. 5A, in a write operation, header sections 502 would be skipped and data can be directly written to data sections 504 without rewriting the header sections. With file structure 505 shown in FIG. 5B, in a write operation, header sections 502 would be skipped and data can be directly written to data and footer sections 503 without rewriting the header sections. With file structure 521 shown in FIG. 5C, header section 520 would be skipped and data can be written to data and footer sections 522 in a write operation without rewriting the header section.

As a result, information stored in header sections associated with managing erase operations before a write operation can be eliminated. For example, in an embodiment, header sections, such as header sections 502 and 520 shown in FIGS. 5A-5C, are not configured to store a number of erase operations performed on data sections, such as data sections 504 and data and footer sections 503 and 522. The number of erase operations is a count of erase operations performed on a memory cell or memory block, such as memory block 507. Such number can be used to determine the stress level on a memory block, such as memory block 507 of FIG. 5A, due to erase operations. It should be appreciated that the stress level is associated with reliability of memory cells. A high stress level on a memory cell (i.e., a high number of erase operations performed on the memory cell) may cause the memory cell to fail because materials associated with the memory cell (e.g., insulators, conductors, conductive oxides, and other materials) may break down. Such memory cell failures may result in programming disturbs or problems with data retention. Thus, to avoid memory failures, data may not be written to a memory cell with a high number of erase operations. Here, since erase operations are eliminated, the header sections do not need to track the number of erase operations in managing the memory block usage.

In summary, the above-described embodiments provide methods and systems to write data to a non-volatile memory array without performing an erase before the write. As a result, during a write operation, the header section may be skipped. By eliminating the erase operation before the write operation, the speed of write operations are increased, thereby resulting in non-volatile memory arrays with fast access. Furthermore, the elimination of logic associated with file management of the erase operations reduces memory demands and processing power required to execute the logic. Additionally, the elimination of the erase and rewrite operations reduces the stress on the non-volatile memory array, thereby improving the reliability and life of the non-volatile memory array.

Although the foregoing embodiments have been described in some detail for purposes of clarity of understanding, implementations of the above-described system and techniques is not limited to the details provided. There are many alternative implementations and the disclosed embodiments are illustrative and not restrictive.

What is claimed is:

1. A system including non-Flash re-writeable non-volatile memory, comprising:
a semiconductor substrate including circuitry fabricated on the semiconductor substrate, the circuitry including a processor and a memory controller in electrical communication with each other;
a memory plane in direct contact with and fabricated directly above the semiconductor substrate;
at least one re-writeable two-terminal non-volatile cross-point memory array embedded in the memory plane and including a plurality of first conductive array lines orthogonally oriented to a plurality of second conductive array lines to form a plurality of cross-points, the plurality of first and second conductive array lines are in electrical communication with the memory controller; and
a plurality of re-writeable non-volatile two-terminal memory elements, each memory element is positioned between one of the cross-points and has a first terminal directly electrically coupled with the first conductive array line at its respective cross-point and a second terminal directly electrically coupled with the second conductive array line at its respective cross-point,
wherein the memory controller is specifically configured to perform data operations on the at least one re-writeable two-terminal non-volatile cross-point memory array without having to perform an erase operation prior to a write operation and to perform random access data operations on the at least one re-writeable two-terminal non-volatile cross-point memory array at a data granularity ranging from a single bit of data in a single memory element to at least one block of data in a subset of the plurality of re-writeable non-volatile two-terminal memory elements, and
wherein the memory controller is configured to perform at least some data operations on the at least one re-writeable two-terminal non-volatile cross-point memory array using a file structure including a header section, a data section, and a footer section.

2. The system of claim 1, wherein each re-writeable non-volatile two-terminal memory element is configured to store exactly one bit of data.

3. The system of claim 1, wherein each re-writeable non-volatile two-terminal memory element is configured to store at least two bits of data.

4. The system of claim 1, wherein the file structure is configured for use with a File Allocation Table (FAT) file system.

5. The system of claim 1, wherein the file structure comprises a memory block.

6. The system of claim 5, wherein the memory block is stored in the at least one re-writeable two-terminal non-volatile cross-point memory array.

7. The system of claim 5, wherein the memory block comprises an identifier associated with the at least one re-writeable two-terminal non-volatile cross-point memory array and the identifier is selected from the group consisting of a row of memory, a portion of a row of memory, a memory column, a memory bank, a memory plane, and a sub-plane of a memory plane.

8. The system of claim 1, wherein the footer section includes error correcting code (ECC).

9. The system of claim 8, wherein the footer section further includes information associated with defective bit replacement, defective column replacement, or both.

10. The system of claim 1, wherein the data and footer sections are associated with the header section.

11. The system of claim 10, wherein the header section includes information associated with its respective data section.

12. The system of claim 1, wherein the data section and the footer section comprise a merged data and footer section, and the merged data and footer section are associated with the header section.

13. The system of claim 1, wherein a plurality of data sections and footer sections are merged to form a plurality of merged data and footer sections and the header section is associated with the plurality of merged data and footer sections.

14. The system of claim 1, wherein the memory controller is configured to map a physical address space of the at least one re-writeable two-terminal non-volatile cross-point memory array to a logical address space.

15. The system of claim 1 and further comprising: at least one bus included in the circuitry and electrically coupled with the processor and the memory controller.

16. The system of claim 15, wherein the at least one re-writeable two-terminal non-volatile cross-point memory array is electrically coupled with the at least one bus.

17. The system of claim 1 and further comprising:
a plurality of memory planes that are vertically stacked upon one another and are in contact with one another, and a bottommost of the plurality of the memory planes is in direct contact with the semiconductor substrate.

18. The system of claim 17, wherein at least one of the plurality of the memory planes is divided into memory subplanes.

19. The system of claim 1, wherein each re-writeable non-volatile two-terminal memory element comprises a conductive metal oxide including mobile oxygen ions, the conductive metal oxide is in contact with an electronically insulating layer having a thickness less than 50 Angstroms, the electronically insulating layer is configured for electron tunneling during data operations to the memory element and as an electrolyte for the mobile oxygen ions during write operations to the memory element.

20. The system of claim 19, wherein each re-writeable non-volatile two-terminal memory element is operative to store data as a plurality of conductivity profiles that can be non-destructively determined by applying a read voltage across the terminals of the memory element, and wherein data stored in the memory element is retained in the absence of electrical power.

* * * * *